US008760254B2

(12) United States Patent
McBee et al.

(10) Patent No.: US 8,760,254 B2
(45) Date of Patent: Jun. 24, 2014

(54) APPARATUS AND METHOD FOR MOUNTING AN OVERHEAD MONITORING DEVICE

(75) Inventors: Bruce W. McBee, Brookfield, WI (US); Gregg James Haensgen, Menomonee Falls, WI (US); John Fredrick Banting, Waukesha, WI (US); William J. Kostolni, Crivitz, WI (US); Bryan C. Cochran, Lakeville, MN (US)

(73) Assignee: Cooper Technologies Company, Houston, TX (US)

( * ) Notice: Subject to any disclaimer, the term of this patent is extended or adjusted under 35 U.S.C. 154(b) by 241 days.

(21) Appl. No.: 13/205,824

(22) Filed: Aug. 9, 2011

(65) Prior Publication Data

US 2012/0038446 A1 Feb. 16, 2012

Related U.S. Application Data

(60) Provisional application No. 61/372,360, filed on Aug. 10, 2010.

(51) Int. Cl.
*H01F 38/20* (2006.01)
*H01F 27/26* (2006.01)
*H02H 3/08* (2006.01)

(52) U.S. Cl.
USPC ........... 336/174; 336/175; 336/210; 361/93.6

(58) Field of Classification Search
CPC ....... H01F 27/04; H01F 27/06; H01F 27/303; H01F 27/266; H02G 7/00; H02G 7/056; G01R 1/22
USPC .......... 336/174, 175, 176, 197, 210; 324/127; 361/93.6
See application file for complete search history.

(56) References Cited

U.S. PATENT DOCUMENTS

| 2,273,534 A | 2/1942 | Mitchell |
| 2,953,757 A | 9/1960 | Yarrick et al. |

(Continued)

FOREIGN PATENT DOCUMENTS

| EP | 0589729 A2 | 3/1994 |
| FR | 2717582 A1 | 9/1995 |
| WO | WO 2007/143378 A2 | 12/2007 |

OTHER PUBLICATIONS

International Search Report and Written Opinion for corresponding PCT international patent application No. PCT/US2011/047016, mailed Dec. 7, 2011 (7 pages).

(Continued)

*Primary Examiner* — Alexander Talpalatski
*Assistant Examiner* — Joselito Baisa
(74) *Attorney, Agent, or Firm* — King & Spalding LLP

(57) ABSTRACT

An apparatus is provided for securing to and collecting power from an electrical conductor including a wire clamp that clamps and secures to an electrical conductor, a current transformer ("CT") that clamps to the electrical conductor and collects power from the electrical conductor, and a housing that supports the wire clamp and the current transformer. According to various aspects, the apparatus may include a wire clamp including a compression post and clamp arms that surround and compress an electrical conductor in a closed position of the wire clamp, where each of the clamp arms includes pivot posts, and the clamp arms pivot between closed and open positions. According to other various aspects, the apparatus may include a split magnetic core that surrounds an electrical conductor in a closed position of the current transformer, where the split magnetic core includes pivot posts, and the split magnetic core pivots between closed and open positions.

19 Claims, 13 Drawing Sheets

(56) References Cited

U.S. PATENT DOCUMENTS

| | | | |
|---|---|---|---|
| 3,025,512 A | 3/1962 | Bloechl |
| 3,364,481 A | 1/1968 | Fuzzell |
| 3,460,038 A | 8/1969 | Ziegler |
| 3,700,967 A | 10/1972 | Hoss |
| 3,720,872 A | 3/1973 | Russell et al. |
| 3,725,846 A | 4/1973 | Strain |
| 3,735,248 A | 5/1973 | Reese |
| 3,816,816 A | 6/1974 | Schweitzer, Jr. |
| 3,995,243 A | 11/1976 | Malmborg |
| 4,000,462 A | 12/1976 | Boyd et al. |
| 4,037,155 A | 7/1977 | Ahmed |
| 4,045,726 A | 8/1977 | Schweitzer, Jr. |
| 4,157,520 A | 6/1979 | Moates et al. |
| 4,165,528 A | 8/1979 | Schweitzer, Jr. |
| 4,288,743 A | 9/1981 | Schweitzer |
| 4,335,437 A | 6/1982 | Wilson et al. |
| 4,384,289 A | 5/1983 | Stillwell et al. |
| 4,456,873 A | 6/1984 | Schweitzer, Jr. |
| 4,466,042 A | 8/1984 | Zylstra et al. |
| 4,495,489 A | 1/1985 | Schweitzer, Jr. |
| 4,510,476 A | 4/1985 | Clatterbuck et al. |
| 4,558,310 A | 12/1985 | McAllise |
| 4,593,276 A | 6/1986 | Aida et al. |
| 4,630,218 A | 12/1986 | Hurley |
| 4,661,813 A | 4/1987 | Mazzamauro et al. |
| 4,686,518 A | 8/1987 | Schweitzer, Jr. |
| 4,694,599 A | 9/1987 | Hart et al. |
| 4,739,149 A | 4/1988 | Nishiwaki et al. |
| 4,746,241 A | 5/1988 | Burbank, III |
| 4,758,962 A | 7/1988 | Fernandes |
| 4,794,328 A * | 12/1988 | Fernandes et al. ............ 324/127 |
| 4,794,332 A | 12/1988 | Schweitzer, Jr. |
| 4,795,982 A | 1/1989 | Schweitzer, Jr. |
| 4,799,005 A | 1/1989 | Fernandes |
| 4,801,937 A | 1/1989 | Fernandes |
| 4,847,780 A | 7/1989 | Gilker et al. |
| 4,881,028 A | 11/1989 | Bright |
| 4,886,980 A | 12/1989 | Fernandes et al. |
| 4,984,124 A | 1/1991 | Yeh |
| 5,029,039 A | 7/1991 | Yeh |
| 5,095,274 A | 3/1992 | Brokaw |
| 5,155,440 A | 10/1992 | Huang |
| 5,159,319 A | 10/1992 | Dunk et al. |
| 5,220,311 A | 6/1993 | Schweitzer, Jr. |
| 5,241,444 A | 8/1993 | Yeh |
| 5,258,903 A | 11/1993 | Rodriguez-Cavazos |
| 5,341,088 A | 8/1994 | Davis |
| 5,397,982 A | 3/1995 | Van Lankvelt |
| 5,426,360 A * | 6/1995 | Maraio et al. .................. 324/126 |
| 5,440,234 A | 8/1995 | Kondo |
| 5,475,371 A | 12/1995 | Dunk et al. |
| 5,485,545 A | 1/1996 | Kojima et al. |
| 5,497,096 A | 3/1996 | Banting |
| 5,537,327 A | 7/1996 | Snow et al. |
| 5,548,279 A | 8/1996 | Gaines |
| 5,559,500 A | 9/1996 | Kase |
| 5,574,387 A | 11/1996 | Petsche et al. |
| 5,576,632 A | 11/1996 | Petsche et al. |
| 5,629,870 A | 5/1997 | Farag et al. |
| 5,630,954 A | 5/1997 | Toth |
| 5,650,728 A | 7/1997 | Rhein et al. |
| 5,661,626 A | 8/1997 | Takeuchi |
| 5,675,497 A | 10/1997 | Petsche et al. |
| 5,714,886 A | 2/1998 | Harris |
| 5,726,847 A | 3/1998 | Dalstein |
| 5,734,575 A | 3/1998 | Snow et al. |
| 5,754,383 A | 5/1998 | Huppertz et al. |
| 5,784,233 A | 7/1998 | Bastard et al. |
| 5,796,631 A | 8/1998 | Iancu et al. |
| 5,805,400 A | 9/1998 | Kim |
| 5,945,820 A | 8/1999 | Namgoong et al. |
| 5,959,537 A | 9/1999 | Banting et al. |
| 6,344,748 B1 | 2/2002 | Gannon |
| 6,535,797 B1 | 3/2003 | Bowles et al. |
| 6,538,797 B1 | 3/2003 | Hunt |
| 6,587,027 B1 | 7/2003 | Nadd |
| 6,677,743 B1 | 1/2004 | Coolidge et al. |
| 6,687,574 B2 | 2/2004 | Pietrowicz et al. |
| 6,798,211 B1 | 9/2004 | Rockwell et al. |
| 6,815,932 B2 | 11/2004 | Wall |
| 6,963,226 B2 | 11/2005 | Chiang |
| 7,010,437 B2 | 3/2006 | Lubkeman et al. |
| 7,256,701 B2 | 8/2007 | Kono et al. |
| 7,274,186 B2 * | 9/2007 | Yakymyshyn et al. ... 324/117 R |
| 7,282,944 B2 | 10/2007 | Gunn et al. |
| 7,312,603 B2 | 12/2007 | Luo et al. |
| 7,312,686 B2 | 12/2007 | Bruno |
| 7,382,272 B2 | 6/2008 | Feight |
| 7,398,097 B2 | 7/2008 | Parkulo |
| 7,453,267 B2 | 11/2008 | Westbrock, Jr. et al. |
| 7,495,574 B2 | 2/2009 | Rocamora et al. |
| 7,518,529 B2 | 4/2009 | O'Sullivan et al. |
| 7,557,583 B2 | 7/2009 | Gunn et al. |
| 7,576,548 B1 | 8/2009 | Lo et al. |
| 7,609,158 B2 | 10/2009 | Banting et al. |
| 7,692,538 B2 | 4/2010 | Schweitzer, III et al. |
| 7,714,735 B2 | 5/2010 | Rockwell |
| 7,733,094 B2 | 6/2010 | Bright et al. |
| 7,733,224 B2 | 6/2010 | Tran |
| 7,746,241 B2 | 6/2010 | Feight et al. |
| 7,777,605 B2 | 8/2010 | Zumoto et al. |
| 7,864,012 B2 | 1/2011 | Merck et al. |
| 7,868,776 B2 | 1/2011 | Kesler et al. |
| 7,930,141 B2 | 4/2011 | Banting |
| 7,956,763 B2 * | 6/2011 | Mies ............................ 340/664 |
| 8,342,494 B2 * | 1/2013 | Ricci et al. ...................... 269/86 |
| 8,395,372 B2 * | 3/2013 | Harlev et al. ................... 324/96 |
| 8,441,817 B2 | 5/2013 | Pääjärvi |
| 8,536,857 B2 | 9/2013 | Nero, Jr. |
| 2004/0183522 A1 | 9/2004 | Gunn et al. |
| 2005/0017751 A1 | 1/2005 | Gunn et al. |
| 2005/0146220 A1 | 7/2005 | Hamel et al. |
| 2005/0151659 A1 | 7/2005 | Donovan et al. |
| 2006/0063522 A1 | 3/2006 | McFarland |
| 2006/0187074 A1 | 8/2006 | O'Sullivan et al. |
| 2006/0279910 A1 * | 12/2006 | Gunn et al. .................. 361/600 |
| 2007/0059986 A1 | 3/2007 | Rockwell |
| 2007/0086135 A1 | 4/2007 | Swartzendruber et al. |
| 2007/0136010 A1 | 6/2007 | Gunn et al. |
| 2007/0285201 A1 | 12/2007 | Zumoto et al. |
| 2008/0077336 A1 | 3/2008 | Fernandes |
| 2008/0284585 A1 | 11/2008 | Schweitzer, III et al. |
| 2009/0115426 A1 | 5/2009 | Muench, Jr. et al. |
| 2009/0231764 A1 | 9/2009 | Banting et al. |
| 2010/0013457 A1 * | 1/2010 | Nero, Jr. ....................... 324/119 |
| 2010/0085036 A1 | 4/2010 | Banting et al. |

OTHER PUBLICATIONS

"Examination Report from the Intellectual Property Office" dated Jan. 1, 2012, including Search Report, for related Taiwanese patent application No. 09614009 (5 pages).

"Research for Structure of Wireless Sensor Networks based on power transmission hallway", Peng Zheng et al., Engineering Journal of Wuhan University, vol. 39, No. 3, Jun. 30, 2006, pp. 12-16, cited in office action dated Nov. 9, 2011 for related Chinese patent application No. 200780048163.5 (6 pages).

Spectrum, The Institute of Electrical and Electronic Engineers, Inc., "New Ways to Play, Electronic Music Interfaces," Dec. 1997, 3 pages.

Cooper Power Systems, Fault Indicators, S.T.A.R.™, Faulted Circuit Indicators, Electrostatic Reset Type, Electrical Apparatus 320-60, May 1997, 4 pages.

Cooper Power Systems, Fault Indicators, S.T.A.R.™ Faulted Circuit Indicators, Low Voltage Reset Type, Electrical Apparatus 320-50, May 1997, 4 pages.

Cooper Power Systems, Fault Indicators, S.T.A.R.™ Faulted Circuit Indicators, Test Point Reset Type, Electrical Apparatus 320-40, May 1997, 4 pages.

(56) References Cited

OTHER PUBLICATIONS

Cooper Power Systems, Fault Indicators, S.T.A.R.™ Type ER Faulted Circuit Indicator, Installation Instructions, Service Information, S320-60-1, Dec. 1997, 2 pages.
Cooper Power Systems, Fault Indicators, S.T.A.R.™ Type LV Faulted Circuit Indicator, Installation Instructions, Service Information S320-50-1, May 1997, 4 pages.
Cooper Power Systems, Fault Indicators, S.T.A.R.™ Type TPR Faulted Circuit Indicator, Installation Instructions, Service Information S320-40-1, Dec. 1997, 3 pages.
Cooper Power Systems, S.T.A.R.™ Faulted Circuit Indicators, Low Voltage Reset Type, Bulletin No. 97035, Jan. 1998, 2 pages.
Cooper Power Systems, S.T.A.R.™ Faulted Circuit Indicators, Test Point Reset Type, Bulletin No. 97034, Jan. 1998, 2 pages.

* cited by examiner

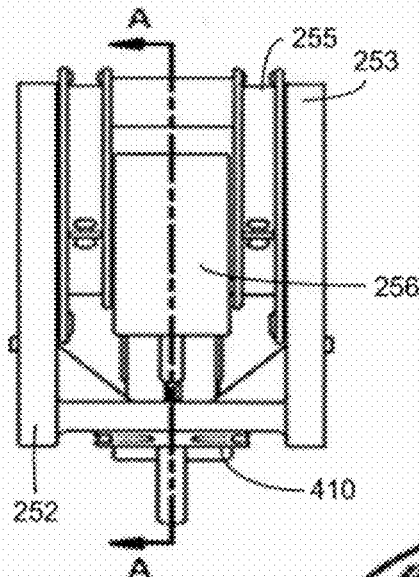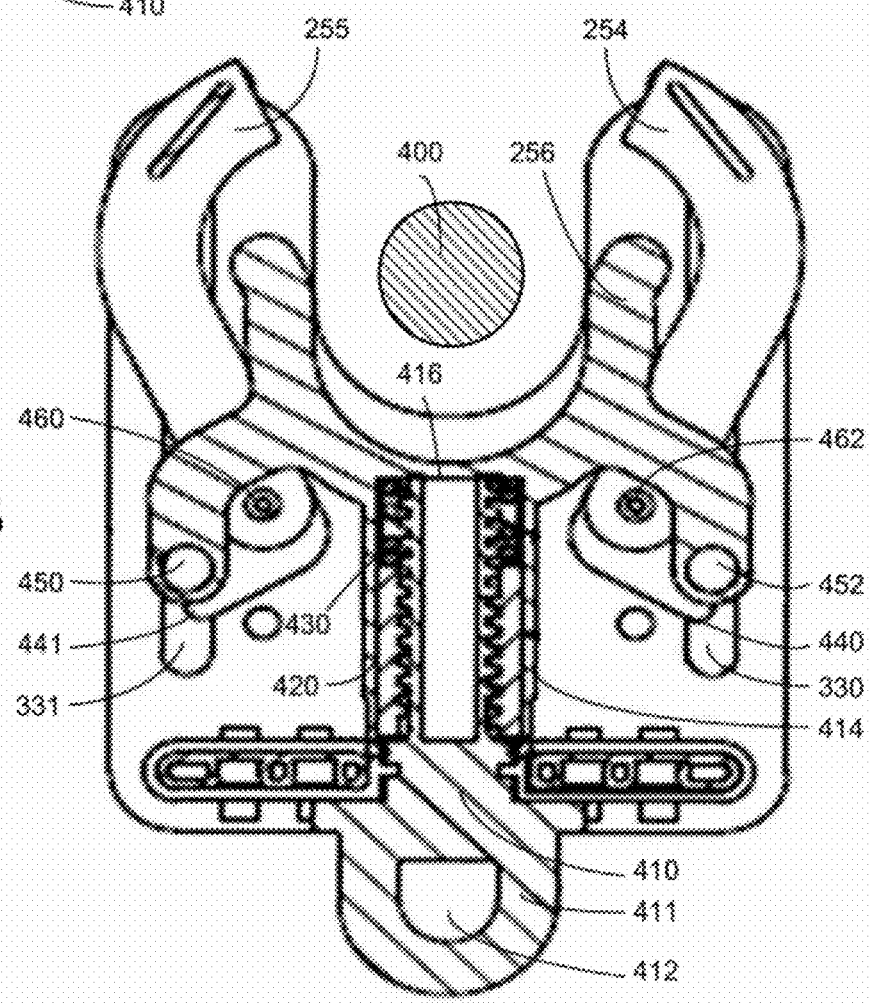

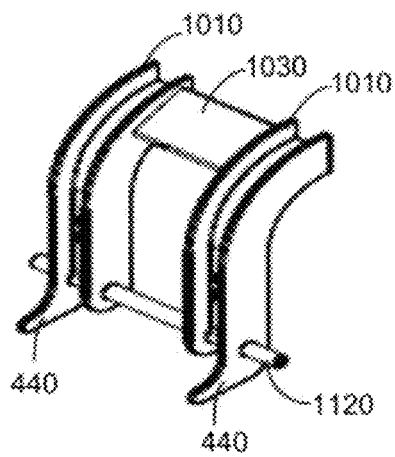 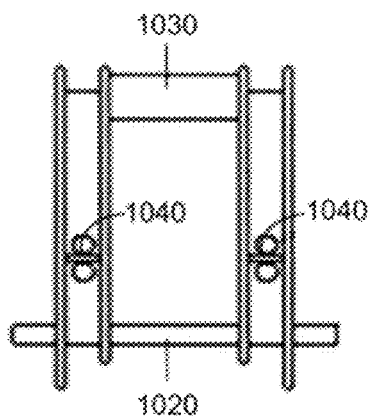 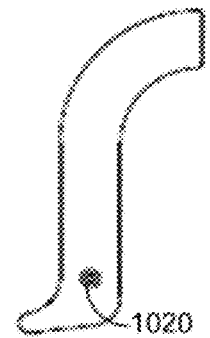
Fig. 10A Fig. 10B Fig. 10C
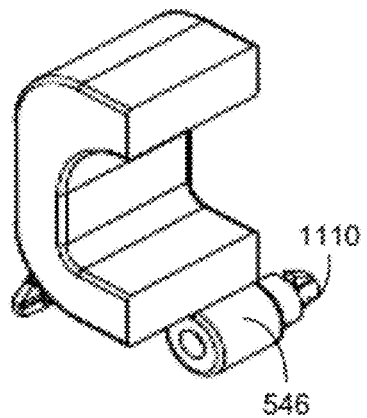 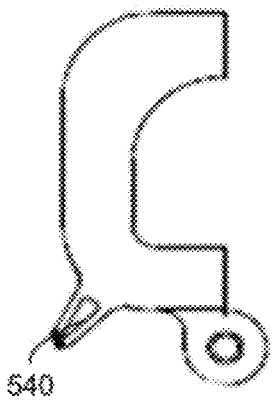 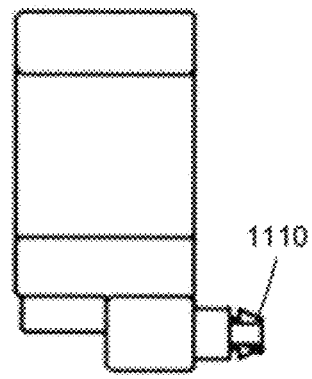
Fig. 11A Fig. 11B Fig. 11C

APPARATUS AND METHOD FOR MOUNTING AN OVERHEAD MONITORING DEVICE

CROSS-REFERENCE TO RELATED APPLICATIONS

This application claims the benefit of U.S. Provisional Application No. 61/372,360, filed Aug. 10, 2010, entitled "Mounting Methods for Overhead Device," the entire contents of which is hereby incorporated herein by reference. This application is related to U.S. patent application Ser. No. 11/982,588, entitled "Communicating Faulted Circuit Indicator Apparatus and Method of Use Thereof," filed Nov. 2, 2007; U.S. patent application Ser. No. 13/205,812, entitled "Apparatus and Method for Mounting an Overhead Device," filed on Aug. 9, 2011; and U.S. patent application Ser. No. 13/205,829, entitled "Apparatus for Mounting an Overhead Monitoring Device," filed on Aug. 9, 2011. The complete disclosure of each of the foregoing priority and related applications are hereby fully incorporated herein by reference.

TECHNICAL FIELD

The present invention generally relates to power line monitoring devices, reliably securing a power line monitoring device to a power line, and reliably powering a power line monitoring device by inductive coupling from a power line.

BACKGROUND

Modern electrical power distribution systems include many independent devices that measure and control the distribution of power from power generating facilities to meter access points. Typically, a "transmission system" transports power from a power generation facility to a substation, and a "distribution system" distributes the generated power from the substation to an end point. The transmission and distribution systems may each include one or more "monitoring devices" that measure, monitor, and/or control power flow. For example, a monitoring device may include a faulted circuit indicator ("FCI"), a current sensor, and/or a voltage sensor that measure, monitor, and/or control power flow on a power line conductor of a transmission or distribution system.

It is desirable to communicate information measured by a monitoring device to a remote facility, such as an automatic metering infrastructure ("AMI"), where it can be analyzed along with information measured by other monitoring devices. To this end, monitoring devices may include wireless communication radios, for example, to wirelessly communicate measured information. Thus, monitoring devices require a power source to supply power to circuitry associated with wireless communication. However, when placed upon a conductor of a distribution system, a power source is not generally available to a monitoring device. Traditional approaches to powering monitoring devices have involved the use of batteries or solar cells, which have a limited lifetime and are unreliable and expensive. Batteries have limited power and cannot provide the ongoing power required monitoring devices on power lines. Solar cells can replenish power in storage devices, but are unreliable due to contamination, weather, snow, and other factors.

Further, a monitoring device should include a means to be securely attached to a power line, even in varying environmental conditions throughout the calendar year. Additionally, it would be desirable for a monitoring device to be configured such that it may be secured to a power line by a field technician without de-energizing the power line, to minimize disruptions in electrical service distribution.

Therefore, a need exists in the art for an improved monitoring device having a means to be reliably secured to a power line and further including a suitable power source.

SUMMARY

An apparatus is provided for securing to and collecting power from an electrical conductor including a wire clamp that clamps and secures to an electrical conductor, a current transformer that clamps to the electrical conductor and collects power from the electrical conductor, and a housing that supports the wire clamp and the current transformer. According to various aspects, the apparatus may include a wire clamp including a compression post and clamp arms that surround and compress an electrical conductor in a closed position of the wire clamp, where each of the clamp arms includes pivot posts, and the clamp arms pivot between closed and open positions. According to other various aspects, the apparatus may include a split magnetic core that surrounds an electrical conductor in a closed position of the current transformer, where the split magnetic core includes pivot posts, and the split magnetic core pivots between closed and open positions.

In other aspects, an apparatus may include a housing including channels, a wire clamp including a compression post, and rods disposed within the channels and secured by the compression post such that the rods slide between first and second positions within the channels based upon movement of the compression post, where, at the first position of the rods, the rods secure the wire clamp and a current transformer in a closed position, and at a second position of the rods, the rods pivot the wire clamp and current transformer to an open position.

In other aspects, an apparatus may include a wire clamp including a compression spring and a threaded nut locked within a cavity of a compression post, where the wire clamp further includes a threaded screw, the threaded screw extends through an opening in a housing into the threaded nut, and the threaded screw is rotatable about an axis of symmetry. In other aspects, the threaded nut may compresses the compression spring to one end of the cavity of the compression post based upon rotation of the threaded screw, to elevate the compression post.

In other aspects, an apparatus may include a wire clamp that clamps to and secures the apparatus to the electrical conductor, a current transformer that clamps to the electrical conductor and collects power from the electrical conductor, and a circuitry housing including a cavity that encloses circuitry associated with the apparatus, where the circuitry includes one or more sensors, and wireless communications circuitry.

In other aspects, a current transformer may include a core and an electrical winding that receives an induced current from magnetic flux generated according to alternating current present on an electrical conductor, a circuit configured to convert the induced current into energy to be stored for consumption by the sensors and the wireless communications circuitry, where the current transformer comprises first and second magnetic core sections, the first and second magnetic core sections being separable.

A method is provided for securing to and collecting power from an electrical conductor including twisting a threaded screw in a first direction to open a recess of a wire clamp and a current transformer, positioning the wire clamp and the CT such that an electrical conductor occupies the recess, and twisting the threaded screw in a second direction to close the wire clamp and the CT and secure the wire clamp and the CT to the electrical conductor.

BRIEF DESCRIPTION OF THE DRAWINGS

For amore complete understanding of the invention and the advantages thereof, reference is now made to the following description, in conjunction with the accompanying figures briefly described as follows:

FIG. 4A illustrates a side view and designated cross-section A-A of a wire clamp according to an embodiment of the present invention;

FIG. 4B illustrates cross section A-A of a wire clamp according to an embodiment of the present invention;

FIGS. 10A-C illustrate various views of a clamp arm according to an embodiment of the present invention;

FIGS. 11A-C illustrate various views of a split core of a current transformer according to an embodiment of the present invention;

DETAILED DESCRIPTION

Figure 1:
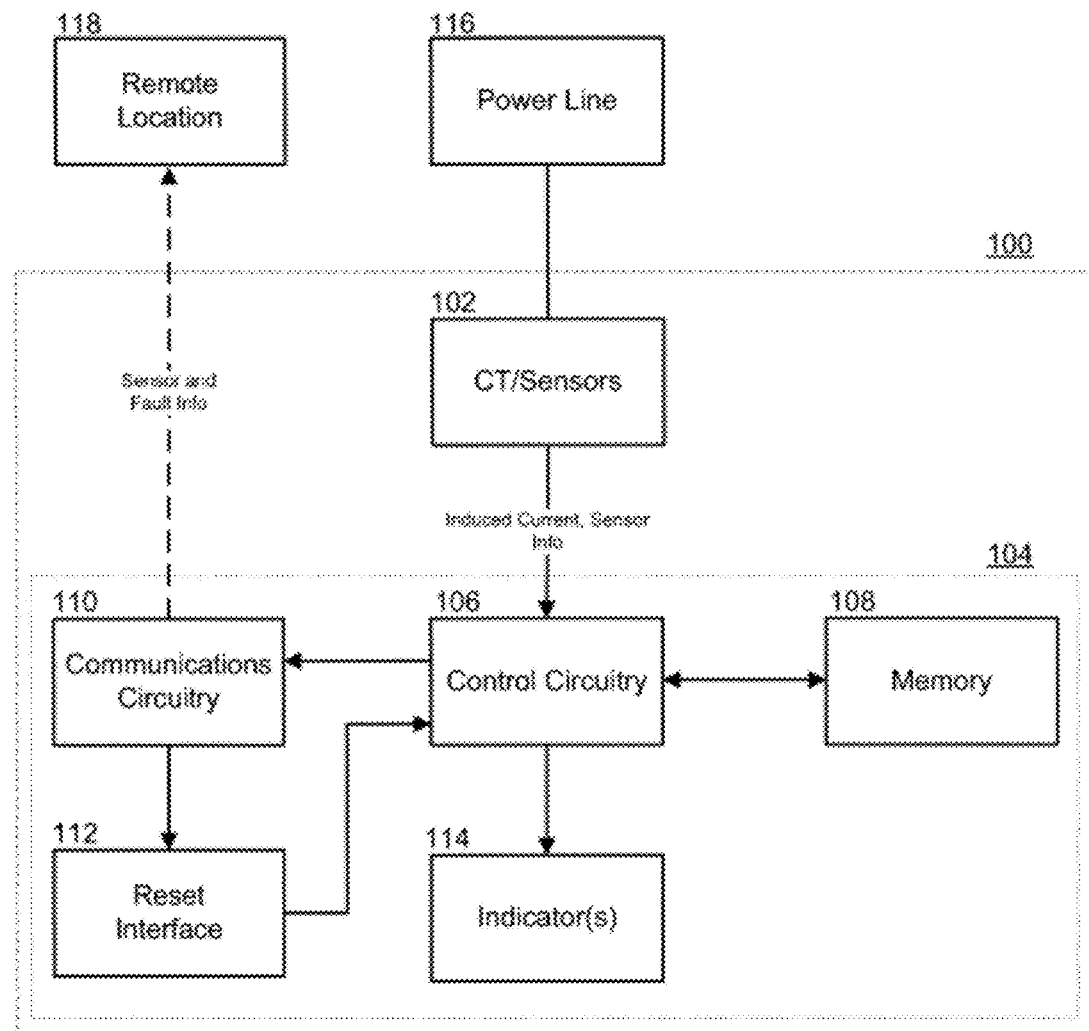
FIG. 1 illustrates a block diagram of a monitoring device according to an embodiment of the present invention.

The present invention is directed to a monitoring device that can be easily secured to a power line without de-energizing or compromising the integrity of the power line. According to the present invention, a monitoring device including a current transformer ("CT") that captures energy via magnetic flux from the power line is secured to a power line. Circuitry associated with the CT converts the energy captured by the CT into energy that may be used by one or more electrical circuits and devices. For example, the energy may power one or more microcontrollers, sensors, wireless communication devices, and/or other circuitry and devices.

The one or more sensors of the monitoring device monitor and collect information related to the power line. For example, the sensors may collect information regarding a current on the power line, a voltage on the power line, a temperature of the power line, and/or information regarding whether a vibration is present on the power line. Among embodiments of the present invention, the one or more wireless communications devices communicate at least a portion of the collected information to a remote location. For example, the information can be communicated to an AMI of a central utility company associated with the power line and/or monitoring device.

In one aspect, the circuitry associated with the monitoring device may include a ground reference point electrically coupled to the power line when the power line monitoring device is secured to the power line. Thus, embodiments of the present invention may include coupling the monitoring device to a ground reference point via a coupling to a power line. In this embodiment, the monitoring device and associated circuitry of the monitoring device maintains a voltage potential of the power line as a ground or reference voltage. Accordingly, a substantially equalized or uniform electric field is present around the monitoring device. As compared to a monitoring device without the equalized and uniform electric field, a monitoring device relying on a power line as a ground or reference voltage is able to conduct wireless communications with reduced noise and interference.

A voltage potential of the monitoring device may be substantially different than a voltage potential of a power line prior to securing the monitoring device to the power line. As such, certain embodiments of the present invention include a pad of semi-conductive material disposed between the power line and the monitoring device to slow a rate of change of the difference in voltage potential between the power line and the monitoring device, when securing the monitoring device to the power line. Slowing down the rate of change can minimize the risk of corona discharge upon securing and/or electrically coupling the monitoring device to the power line.

In certain embodiments of the invention, the CT of the monitoring device includes two "split core" sections which allow the CT to be easily installed having a power line extending through the CT without de-energizing the power line. At least one of the split core sections includes an electrical wire winding wrapped around the section. Thus, when the CT is mounted in proximity to a power line, an alternating magnetic flux field caused by an alternating current conducted by the power line couples to the CT and the electrical wire winding of the CT. An induced current is thus generated in the electrical wire winding of the CT, which can be converted into power for circuitry associated with the monitoring device.

To obtain power from the induced current generated in the electrical winding of the CT, the circuitry associated with the monitoring device may include a pre-regulator circuit that receives the induced current from the CT and develops a voltage matched to a power curve of the CT. In this case, an output of the pre-regulator is coupled to a switching regulator that regulates the voltage to an output voltage suitable for the circuitry associated with the monitoring device, such as a wireless communications device or other device. The circuitry may also include an energy storage device, such as a rechargeable battery or a supercapacitor, that provides power to the circuitry when the power line does not carry an adequate alternating current to induce an adequate current in the electrical wire winding of the CT.

The monitoring device and its associated circuitry are designed to withstand harsh environments and provide reliable operation. For example, the CT may be protected by a housing, epoxy coating, or other means. In addition, a housing of the circuitry associated with the monitoring device may be designed to protect the circuitry and other components from the environment. At least some of the components of the monitoring device may be constructed from materials suitable to withstand exposure to rain, ice, snow, sun, wind, and other environmental conditions.

According to certain aspects of the present invention, a monitoring device is designed such that it may be securely attached to a power line by a field technician without de-energizing the power line. That is, the monitoring device may be attached to the power line using only a hotstick without de-energizing the power line and interrupting power distribution services. Further, the monitoring device of the present invention is designed to provide a secure attachment to the power line, so that it is unlikely that the monitoring device would be unsecured from the power line due to wind, rain, hail, or other environmental conditions.

Turning now to the drawings, in which like numerals indicate like elements throughout, embodiments of the present invention are described in additional detail.

FIG. 1 is a block diagram illustrating a monitoring device 100, in accordance with certain embodiments of the present invention. The monitoring device 100 includes CT and sensors 102 and circuitry 104 associated with the monitoring device. As an example of the circuitry 104 associated with the monitoring device, the circuitry 104 includes control circuitry 106, communications circuitry 110, a memory 108, a reset interface 112, and one or more indicators 114. It is noted that the circuitry 104 illustrated in FIG. 1 is provided as an example only and may include additional circuitry or omit some or all of the components 106, 108, 110, 112, and 114.

Generally, as described in further detail below with reference to FIGS. 2-14, the monitoring device 100 may be securely attached to the power line 116 according to a clamping or other similar mechanical fixing means that ensures a strong mechanical connection between the monitoring device 100 and the power line 116. The term "power line" is used herein to refer to any type of electrical conductor that transmits electricity from one location to another. For example, the power line 116 may include one or more above or underground utility cables that carry and distribute electrical power.

The monitoring device is powered according to an induced current generated in an electrical wire winding of the CT, and the control circuitry 106 may include a pre-regulator circuit that receives the induced current from the CT and develops a voltage based on the induced current. The sensors measure conditions on the power line 116. For example, the sensors may measure a voltage and current present on the power line 116 in real time or near-real time. Among embodiments of the present invention, various types of sensors may be used to measure parameters related to conditions of the power line 116, conditions of the monitoring device 100, or the environment of the power line 116 and the monitoring device 100, such as line temperature, line tilt, ambient temperature, wind speed, liquid levels of electrical components, dissolved gas content or pressure from a monitored transformer, battery status, frequency, harmonics, zero crossings, vibration, and/or power factor. The sensors communicate measurements to the control circuitry 106 for processing. The control circuitry 106 may also store the measurements in the memory 108, provide external indications of the measurements via the indicators 114, and communicate the measurements via the communications circuitry 110.

In certain embodiments, the control circuitry 106 includes a microcontroller programmed to analyze sensor data and to respond according to various events or states. For example, the controller 104 may be configured to process and analyze sensor data, store the sensor data in the memory 108, transmit the sensor data to a remote location 118 via the communications circuitry 110, and provide one or more indications of the sensor data via the indicators 114. That is, the control circuitry 106 may be configured to provide an indication that a fault condition has occurred on the power line 116, based on sensor data.

The control circuitry 106 includes a regulated power supply that takes advantage of an optimal power point of the CT, which is based on a permeability of magnetic core material of the CT, the cross-sectional area of the magnetic core, the number of turns of the electrical wire winding wrapped around the magnetic core, the air gap separating the magnetic core halves, the resonant frequency of the circuit, and other factors such as a wire resistance of the electrical wire winding, switching efficiencies, and other electrical factors. Energy captured by the CT may be stored in an energy storage device such as one or more batteries or capacitors.

The indicators 114 may include one or more light emitting diodes (LEDs) or other indicators, and the indication may include lighting the LEDs to give notice to a field technician of the fault condition. Thus, the indicators 114 may provide a visible indication that a fault has occurred. In certain embodiments, the indicator comprises a high visibility display device, a liquid crystal display (LCD), or other similar display device. Additionally, the indicators 114 may emit an audible sound to alert a technician in a general vicinity that the monitoring device 100 has detected a fault condition.

The memory 108 may include any suitable persistent or semi-persistent memory, such as a flash-based or other type of memory. When the control circuitry 106 determines that sensor data should be recorded, such as when the sensor data indicates an unusual condition or fault, the control circuitry 106 may record the sensor data in the memory 108, along with a record of information related to the sensor data such as a time the sensor data was measured, the geographic coordinates of the monitoring device 100, ambient conditions at the time the sensor data was measured, or other similar data.

In certain embodiments, the memory 108 may also store information associated with the monitoring device 100. For example, upon installation, the memory 108 may be programmed with the global coordinates of the monitoring device 100. Alternatively, the memory 108 may store other identifying information, such as, but not limited to, a street address, a unique identifier of the monitoring device 100, utility grid coordinates, or an identifier of a nearby utility pole or other landmark.

The communications circuitry 110 includes circuitry configured to transmit data to the remote location 118. In some embodiments, the communications circuitry 110 communicates with the remote location 118 using cellular technologies such as GSM (Global System for Mobile communications) or CDMA (Code Division Multiple Access). The communications circuitry 110 may also comprise components of one or more wireless or wired communications protocols known in the art, including any of the 802.11 standards, Bluetooth (IEEE 802.15.1), ZigBee (IEEE 802.15.4), Internet Protocol, licensed or un-licensed radio, fiber, or power line carrier communications technologies.

The remote location 118 may be associated with a utility company's central office and includes the capability of simultaneously monitoring communication feeds from numerous monitoring devices 100 and communicating information from those feeds to an entity responsible for repair and maintenance of transmission and distribution systems. In this embodiment, the remote location 118 may comprise a central server connected to a utility company's outage management system. Upon receiving information indicating fault or sensor data from a monitoring device 100, the server processes and transmits the information to the outage management system. Either the server or the outage management system may also direct communications to the entity responsible for repair and maintenance systems associated with the fault or sensor data.

The reset interface 112 may include one or more reset operations, such as an indicator reset and a memory reset. In this context, the indicator reset operation removes a fault indication provided on the indicators 114, while the memory reset operation clears at least some sensor data from the memory 108. The memory reset operations may specify certain parameters to be cleared. For example, the memory reset operation may specify that only sensor data recorded before a certain date should be cleared, that all sensor data should be cleared, that sensor data and information relating to the monitoring device 100 should be cleared, that all data other than information relating to the monitoring device 100 should be cleared, and/or other similar parameters.

In certain embodiments, the control circuitry 106 may be programmed to respond to a correction of a previously identified fault event by executing an indicator reset operation but not a memory reset instruction. In this case, a record of the fault event, as well as the conditions that accompanied the fault event, will remain in memory 108 even though the indication of the fault is cleared from the indicators 114. Additionally, the reset interface 112 may receive a reset instruction directly from an "on-site" field technician via one or more buttons of the monitoring device 100, from an input device connected to the monitoring device 100, or from other similar input methods or devices.

Turning now to FIGS. 2-14, a physical structure of a monitoring device 200 according to embodiments of the present invention is described in detail. As illustrated among FIGS. 2-14, the monitoring device 200 is configured to attach to and hang from an electrical conductor. The electrical conductor may include a power or neutral line of an electricity distribution system, for example. According to aspects of the present invention, the monitoring device 200 is designed to have a weight not greater than that supportable by the electrical conductor, so that the monitoring device 200 may be safely and reliably supported. It is additionally noted that some elements of the monitoring device 200 discussed below may be constructed from any material suitable to withstand exposure to environmental conditions and safe for use in proximity to high voltage power lines, such as a synthetic plastic or semi-synthetic plastic solid material or other material known in the art to be suitable for the application.

Figure 2A:
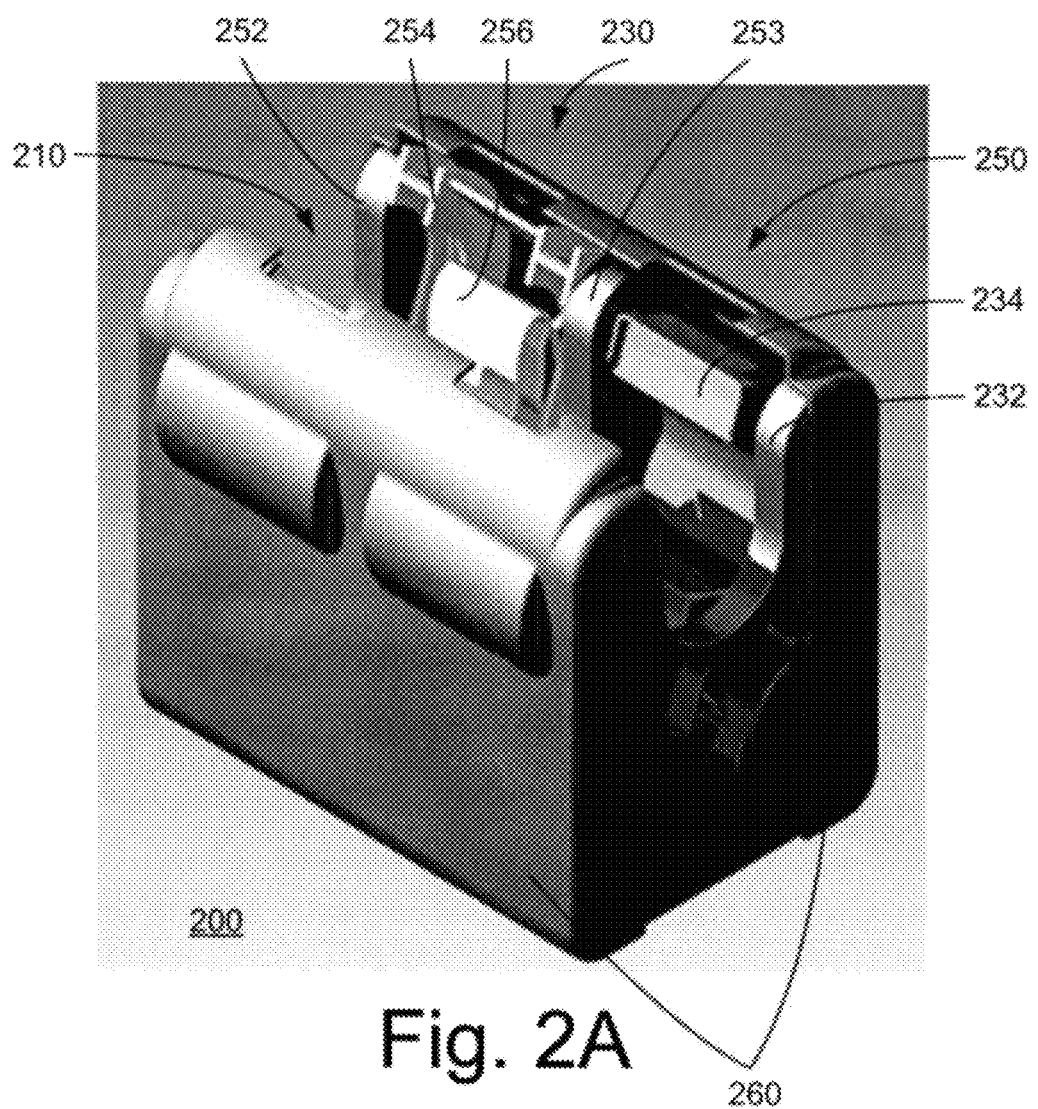
FIG. 2A illustrates a perspective view of a monitoring device according to an embodiment of the present invention.
Figure 2B:
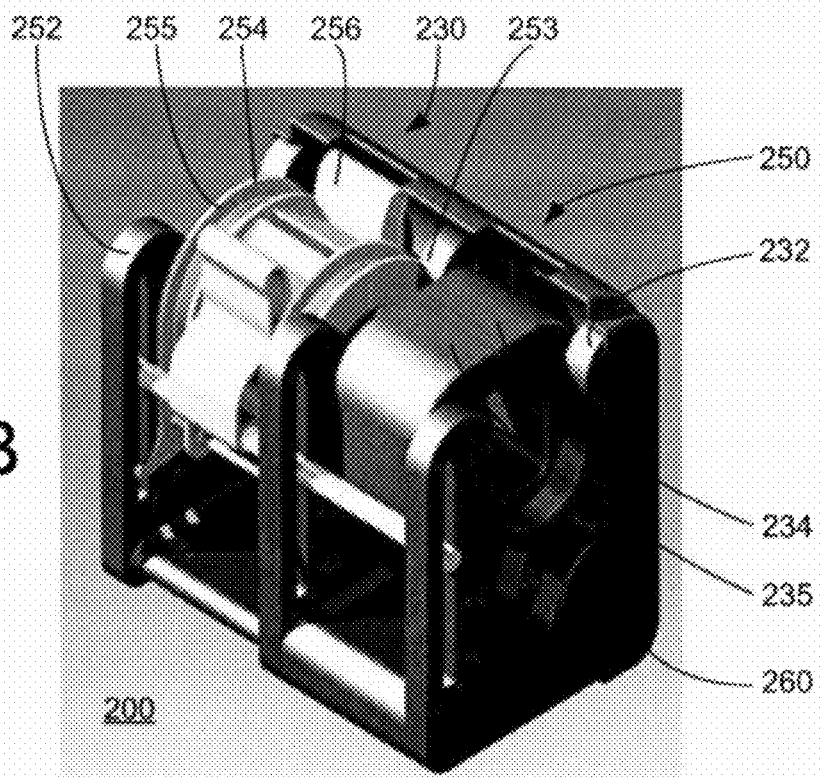
FIG. 2B illustrates a perspective view of a monitoring device according to an embodiment of the present invention, in an closed position without a front cover.
Figure 2C:
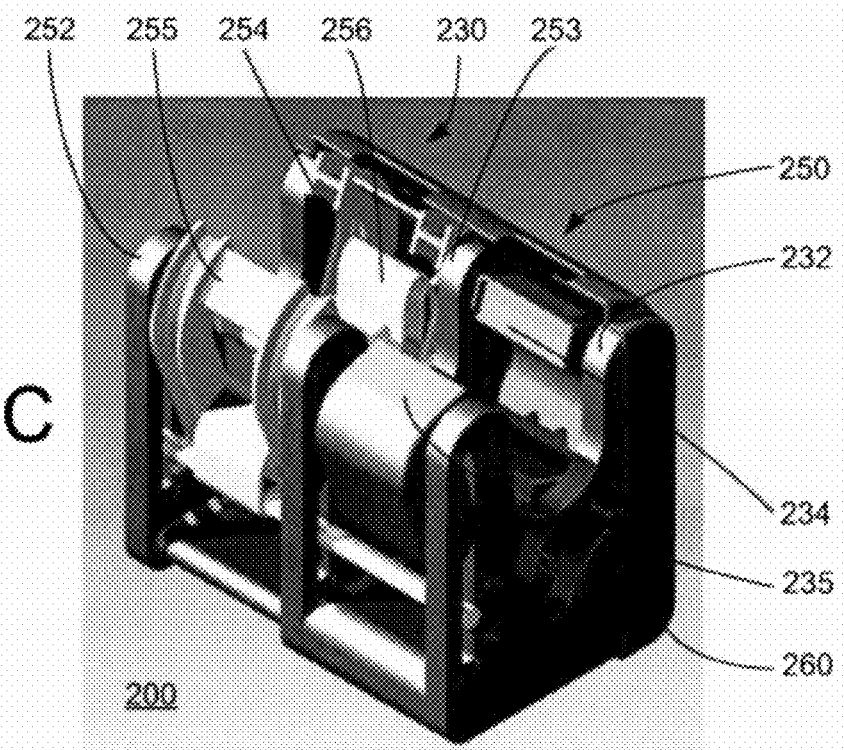
FIG. 2C illustrates a perspective view of a monitoring device according to an embodiment of the present invention, in an open position without a front cover.

With reference to FIGS. 2A-C, FIG. 2A illustrates an example embodiment of the monitoring device 200 in an open position, and FIGS. 2B and 2C illustrate an example embodiment of the monitoring device 200 in closed and open positions, respectively, without a front cover.

As illustrated among FIGS. 2A-C, the monitoring device 200 includes a wire clamp 230, a current transformer ("CT") 250, wire clamp housing portions 252 and 253, CT housing 232, first and second clamp arms 254 and 255, a compression post 256, and split CT cores 234 and 235. In operation, the monitoring device 200 is positioned with an electrical conductor (see FIGS. 4A and 5B, reference 400, for example) occupying a recess 210 (see FIG. 2A), and the monitoring device 200 is clamped and secured to the electrical conductor, as described in additional detail below.

The CT 250 is formed, adapted, and configured to capture an induced current based on an alternating current conducted over the electrical conductor. The induced current is utilized to power circuitry, such as the circuitry 104 discussed above. The wire clamp 230 is formed, adapted, and configured to securely clamp the monitoring device 200 to the electrical conductor. When the monitoring device 200 is closed, the first and second clamp arms 254 and 255 and the split CT cores 234 and 235 are clamped together, and the compression post 256 is at an elevated position. When the monitoring device 200 is open, the first and second clamp arms 254 and 255 and the split CT cores 234 and 235 are pivoted apart to create the recess 210, and the compression post 256 is at a lower position. Housings 252, 253, and 232 provide internal support and framing for the individual parts or elements that comprise the monitoring device 200, as discussed in further detail below.

Figure 3A:
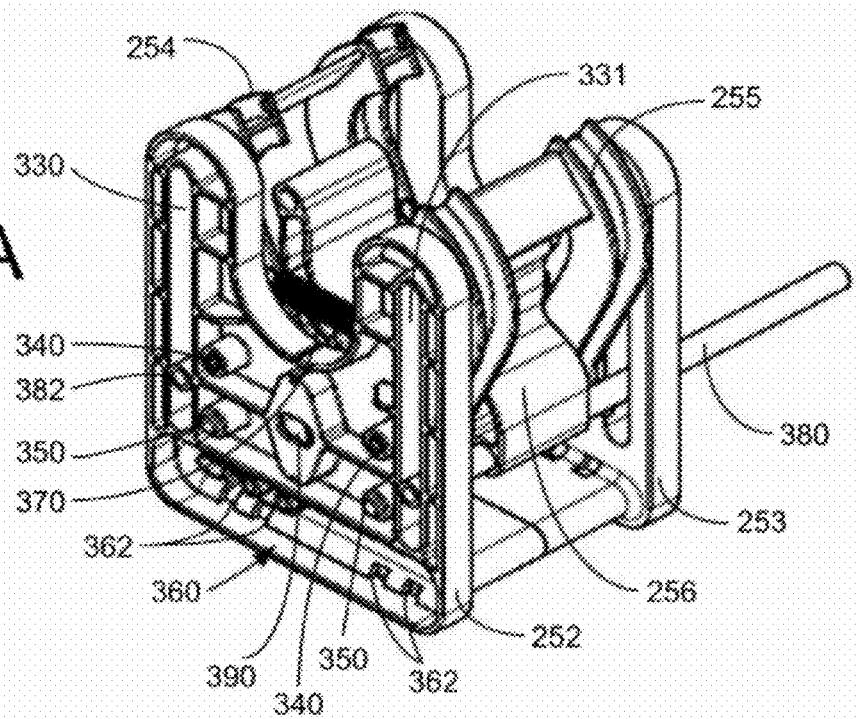
FIG. 3A illustrates a perspective view of a wire clamp in an open position according to an embodiment of the present invention.

With reference to FIG. 3A, an embodiment of the wire clamp 230 is further described. As illustrated, the wire clamp 230 comprises first and second wire clamp housing portions 252 and 253. In the illustrated embodiment, each of the first and second wire clamp housing portions 252 and 253 are formed having the same features. More specifically, the housing portions 252 and 253 are interchangeable. Each housing portion 252 and 253 includes wire clamp rod channels 330 and 331, clamp arm pivot holes 340, cover mounting holes 350, a CT housing tab receptacle 360, securing pin receptacles 362, and CT pivot hole 390.

The wire clamp rod channels 330 and 331 direct movement of rods 380 and 382. As illustrated in FIG. 3A, in the open position of the monitoring device 200, the rods 380 and 382 are at a lowered position within the channels 330 and 331. In the lowered position, the rods 380 and 382 pivot the first and second clamp arms 254 and 255 to an open position. On the other hand, in the closed position of the monitoring device 200 (see FIG. 2B), the rods 380 and 382 are elevated and maintain the first and second clamp arms 254 and 255 in a closed position. It is noted that the first and second clamp arms 254 and 255 are biased to the closed position by clamp arm springs 370. Pivoting of the first and second clamp arms 254 and 255 is described in further detail with reference to FIGS. 4A and 4B below.

The cover mounting holes 350 may be used to secure the covers 260 to the housing portions 252 and 253 of the monitoring device 200. The covers 260 are described in further detail with reference to FIG. 14 below. The housing tab receptacle 360 is formed to receive a mounting tab of the CT housing 232. Additionally, the securing pin receptacles 362 are formed to receive securing pins of the CT housing 232 as described in further detail below with reference to FIGS. 7A-D. The CT pivot hole 390 is formed to receive a CT pivot post of one of the CT split cores 234 and 235. Although the CT pivot hole 390 of the first wire clamp housing 252 is not occupied by a CT pivot post in the illustration, a similar CT pivot hole 390 (not shown) of the second wire clamp housing 253 is occupied by a mounting post of the second CT core 235 when the monitoring device 200 is fully assembled.

Figure 3B:
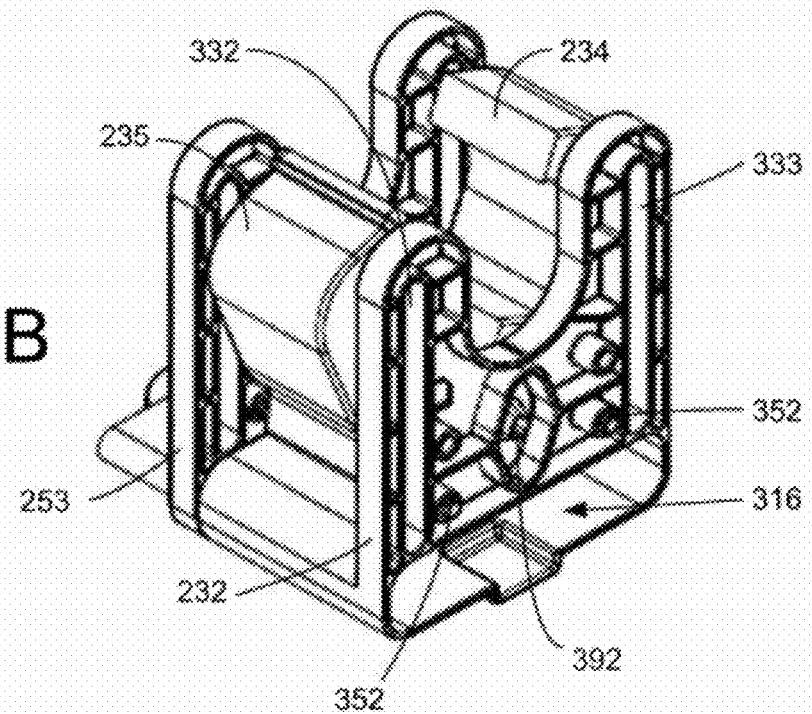
FIG. 3B illustrates a perspective view of a current transformer in an open position according to an embodiment of the present invention.

With reference to FIG. 3B, an embodiment of the CT 250 is further described. As illustrated, the CT 250 comprises CT housing 232, a CT circuitry housing cavity 316, CT rod channels 332 and 333, cover mounting holes 352, and a CT pivot hole 392. The CT circuitry housing cavity 316 comprises an open area within the CT housing 232 in which circuitry such as the circuitry 104 may be enclosed. Among embodiments, any circuitry enclosed within the CT circuitry housing cavity 316 may be secured by potting compound, epoxy, mechanical fasteners, combinations thereof, or any other means known in the art suitable for the application. It is further noted that additional circuitry associated with the monitoring device 200, including antennas and indicators, may be enclosed in one or more additional circuitry housings associated with the monitoring device 200.

The CT rod channels 332 and 333 direct movement of the rods 380 and 382. As illustrated in FIGS. 2B and 2C, the rods 380 and 382 extend across the wire clamp 230 and the CT 250 in one direction though the wire clamp rod channels 330 and 331 and the CT rod channels 332 and 333. In the closed position of the monitoring device, the rods 380 and 382 are at a lowered position (see FIG. 2A) within the channels 332 and 333. In the lowered position, the rods 380 and 382 cause the split CT cores 234 and 235 to pivot to an open position. On the other hand, in the closed position of the monitoring device 200 (see FIG. 2B), the rods 380 and 382 are elevated and maintain the split CT cores 234 and 235 in a closed position. In one embodiment, the split CT cores 234 and 235 are biased to the closed position by a CT core spring. The pivoting of the split CT cores 234 and 235 is described in further detail with reference to FIGS. 5A-B below. The cover mounting holes 352 may be used to secure the covers 260 to the CT housing 232. The CT pivot hole 392 is formed to receive a CT pivot post of one of the split CT cores 234 and 235.

Turning to FIGS. 4A and 4B, an example embodiment of the wire clamp 230 is further described. FIG. 4A illustrates a side view of the wire clamp 230, including the second clamp arm 255, the compression post 256, and the first and second wire clamp housings 252 and 253. FIG. 4A additionally designates cross-section A-A of the wire clamp 230 and illustrates a portion of a threaded screw 410.

FIG. 4B illustrates the cross-section A-A of the wire clamp 230. FIG. 4B also illustrates a cross-section of an electrical conductor 400 as an example. At one end, the compression post 256 includes a "U" shape that cradles and presses the electrical conductor 400 into the clamp arms 254 and 255 when the monitoring device 200 is closed. Projecting down from the "U" shaped cradle of the compression post 256, two elongated arms extend to coincide with positions of the rod channels 330-333 of the housings 232, 252, and 253. At ends of the elongated arms, rod eyes 450 and 452 secure the rods 380 and 382, respectively. Thus, any movement of the compression post 256 is translated into movement of the rods 380 and 382 to open and close the wire clamp 230 and CT 250 as described herein. Additional aspects of the compression post 256 are described in further detail with reference to FIGS. 9A-D.

As illustrated in FIG. 4B, the compression post 256 comprises a cylinder 414 having a cylindrical cavity. In the cylindrical cavity, a threaded nut 420 and compression spring 430 are inserted with the compression spring being positioned between the threaded nut 420 and a top end 416 of the cavity. Both the compression spring 430 and threaded nut 420 are inserted and locked into cylindrical cavity. The threaded nut 420 is formed and adapted to slide within the cylindrical cavity when the threaded screw 410 is twisted. Once inserted into the cavity of the compression post 256, the threaded nut 420 is locked into place. The threaded screw 410 is supported by the wire clamp housing portions 252 and 253, passes between and through the wire clamp housing portions 252 and 253, and is threaded into the threaded nut 420. It is noted that the threaded screw 410 and the threaded nut 420 have mating threads of the same type. Embodiments of the present invention encompass any suitable thread sizing of the threaded screw 410 and the threaded nut 420.

The threaded screw 410 includes a hook 411 at one end that forms an eye 412 for twisting the threaded screw 410 with a hotstick by a field technician. In this manner, the field technician may twist the threaded screw 410 about an axis of symmetry, to adjust a position of the threaded nut 420 within the cavity of the compression post 256. More specifically, when the threaded screw 410 is twisted in a first direction, the threaded nut 420 slides within the cavity between a first bottom position of the cavity toward a second top position of the cavity. The sliding movement of the threaded nut 420 from the bottom to top positions pushes the compression post 256 to the elevated position via the compression spring 430. That is, the compression spring 430 translates the movement of the threaded nut 420 from the bottom to top positions and presses against the top end 416 of the cavity, elevating the compression post 256. As discussed above, movement of the compression post 256 to the elevated position closes the monitoring device and encloses the electrical conductor 400 between the compression post 256 and the clamp arms 254 and 255. It is noted that the cavity includes guide recesses and the threaded nut includes raised guides which permit the threaded nut to slide between the first and second positions without twisting within the cavity of the compression post 256. The guide recesses and raised guides are described and illustrated in further detail with reference to FIGS. 9 and 13 below.

The compression spring 430 provides a function of permitting the compression post 256 to adjust its elevation slightly, to account for expansion and contraction of the electrical conductor 400. That is, even if the electrical conductor 400 expands or contracts due to temperature or humidity, for example, the compression spring 430 provides a nearly uniform and constant pressure to the electrical conductor while permitting the compression rod 256 to adjust its elevation slightly, without causing damage to the wire clamp 230 or the electrical conductor 400.

The field technician may also twist the threaded screw 410 in a second direction to slide the threaded nut 420 within the cavity between the second top position to the first bottom position. The sliding movement from the top to bottom positions pulls the compression post 256 to a lowered position as the threaded nut 420 is pulled to the bottom of the cavity. It is noted that, because the threaded nut 420 is locked within the cavity, the compression post 256 may be pulled (i.e., lowered) until it contacts the wire clamp housing portions 252 and 253, when the threaded screw 410 is twisted in the second direction.

The first and second clamp arms 254 and 255 include fingers 440 and 441, respectively, that open the wire clamp aims 254 and 255 according to downward force applied via the rods 380 and 382 when the compression post 256 is lowered. More specifically, twisting the threaded screw 410 in the second direction causes the threaded nut 420 to move to the bottom of the cylindrical cavity of the compression post 256. Because the threaded nut 420 is locked into the cylindrical cavity, the compression post 256 is pulled in the direction of the threaded nut 420, and the compression post 256 pushes the rods 380 and 382 over the fingers 441 and 440. The downward force applied via the rods 380 and 382 causes the first and second clamp arms 254 and 255 to pivot about the pivot points 460 and 462. The pivot points 460 and 462 are created by posts of the first and second clamp arms 254 and 255 which extend into the clamp arm pivot holes 340. The first and second clamp arms 254 and 255 are spring biased by the clamp arm springs 370 to be closed. Thus, the spring bias is overcome by the downward force applied by the rods 380 and 382 upon the fingers 440 and 441, to open the wire clamp 230.

Figure 5A:
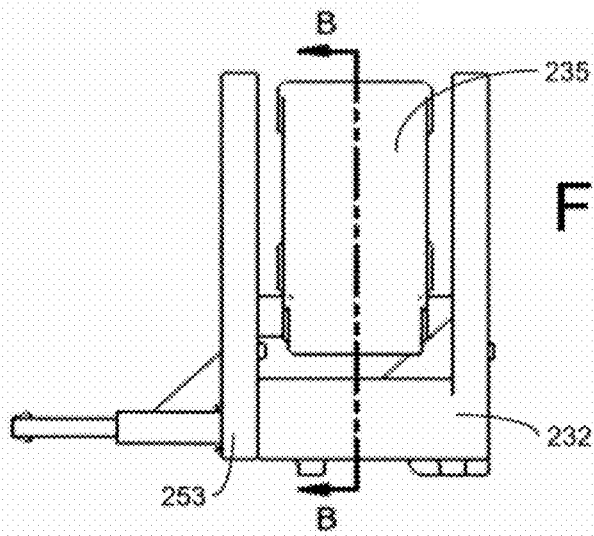
FIG. 5A illustrates a side view and designated cross-section B-B of a current transformer according to an embodiment of the present invention.
Figure 5B:
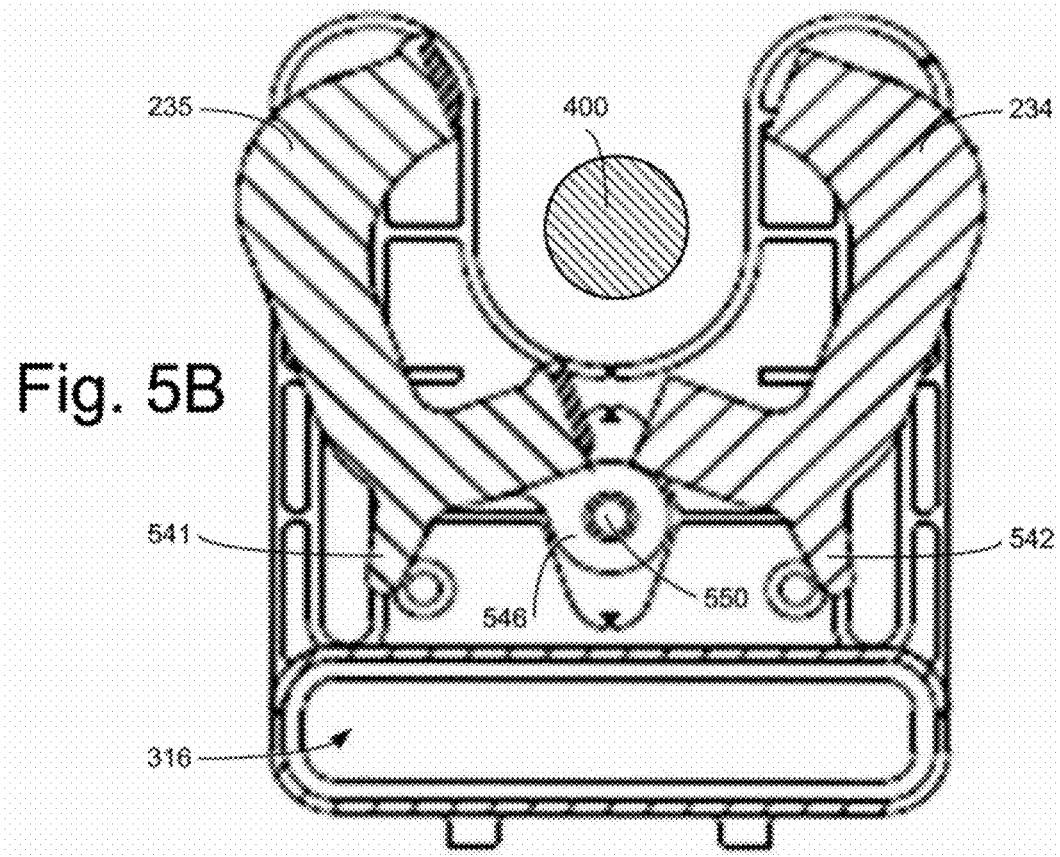
FIG. 5B illustrates cross section B-B of a current transformer according to an embodiment of the present invention.

With reference to FIGS. 5A-B, an embodiment of the CT 250 is further illustrated. FIG. 5A illustrates a side view of the CT 250, including the second CT core half 235, the CT housing 232, and the second wire clamp housing 253. FIG. 5B additionally designates cross-section B-B of the CT 250.

FIG. 5B illustrates the cross-section B-B of the CT 250. As illustrated, the split CT cores 234 and 235 include fingers 541 and 542, respectively, that open the CT 250 according to downward force applied via the rods 380 and 382. The downward force applied via the rods 380 and 382 causes the split CT cores 234 and 235 to pivot about the CT pivot 550. The CT pivot 550 is formed by CT pivot posts 546 which extend into the CT pivot hole 392 of the CT housing 232 and the CT pivot hole 390 of the second wire clamp housing 253. In embodiments of the present invention, the split CT cores 234 and 235 may be spring biased to a closed position by a spring inserted within or between the pivot posts of the CT cores 234 and 235. In the closed position the split CT cores 234 and 235 surround and enclose the electrical conductor 400, so that a current may be induced in an electrical wire winding (not shown) wound around one or both of the split CT cores 234 and 235.

Figure 6A:
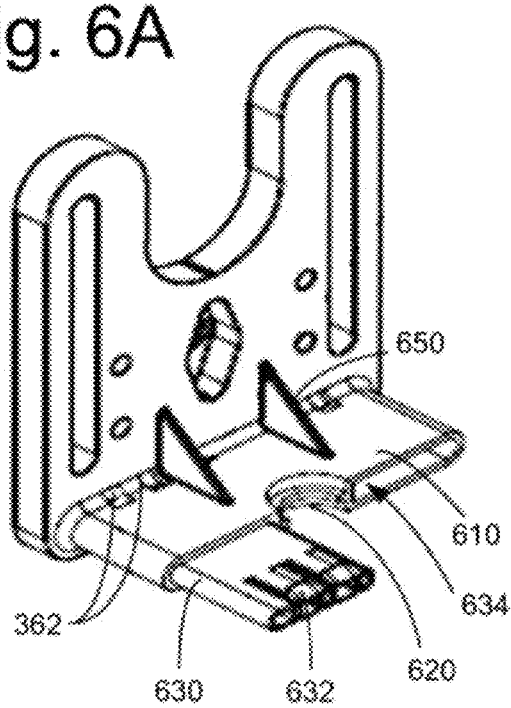
FIGS. 6A-D illustrate various views of a portion of a wire clamp housing according to an embodiment of the present invention.
Figure 6B:
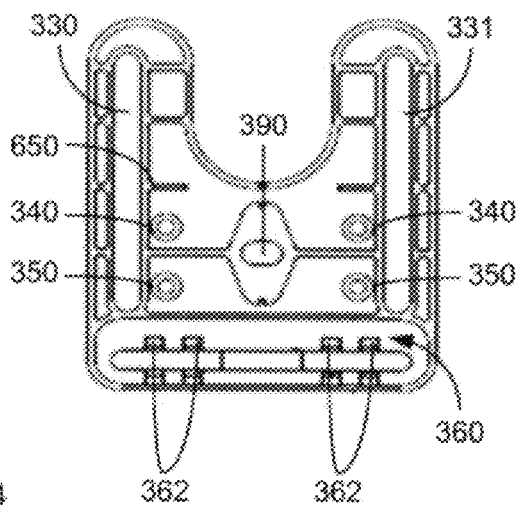
Figure 6C:
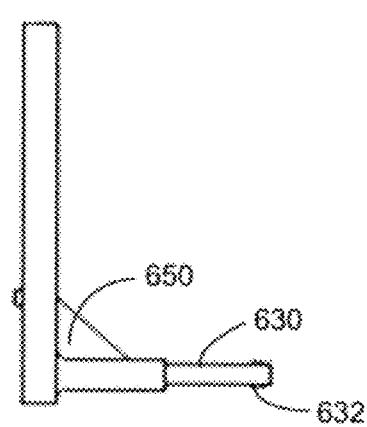
Figure 6D:
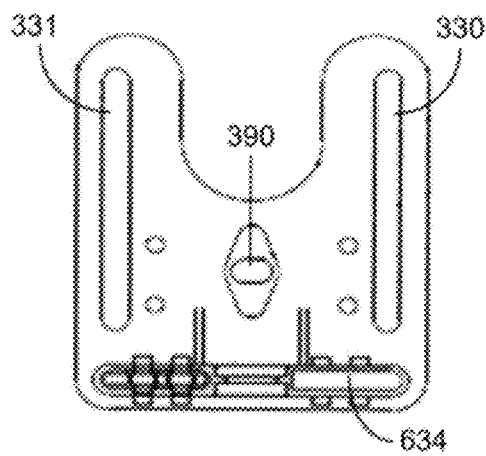

With reference to FIGS. 6A-D, an example embodiment of the first and second wire clamp housing portions 252 and 253 are further described with reference to several views. FIG. 6A is a perspective view of a wire clamp housing portion, FIG. 6B is a front view of a wire clamp housing portion, FIG. 6C is a side view of a wire clamp housing portion, and FIG. 6D is a back view of a wire clamp housing portion. The first and second wire clamp housing portions 252 and 253 are formed to be interchangeable. Thus, the housing illustrated among FIGS. 6A-D may comprise either of the first or second wire clamp housing portions 252 and 253.

The wire clamp housing includes a mating tray 610 that projects nearly perpendicularly from a bottom of the wire clamp housing, a semicircle 620 formed at an approximate center of one side of the mating tray 610, a securing tab 630, securing tab pins 632, a securing tab receptacle 634, securing pin receptacles 362, and support ribs 650.

A length of the mating tray 610 is approximately half a width of the wire clamp 230. The semicircle 620 forms one half of a hole through which the threaded screw 410 extends when the wire clamp 230 is fully assembled. The securing tab 630 of a wire clamp housing portion is inserted into the securing tab receptacle 634 of another portion of the wire clamp housing, and the two portions of the wire clamp housing may be pressed together to form the wire clamp housing. It is noted that the securing tab pins 632 lock into the securing pin receptacles 362 formed at one end of the mating tray 610, as illustrated in FIG. 6A. It is further noted that (4) securing tab pins 632 are provided on the securing tab 630, and that the mating tray 610 includes (8) securing pin receptacles 362 at the one end of the mating tray 610. When the securing tab pins 632 are locked into the securing pin receptacles 362, the wire clamp housing portions 252 and 253 are secured and locked together. Before being secured and locked together, the threaded screw 410 is positioned within the semicircles 620 to additionally secure and lock the threaded screw 410 between the wire clamp housing portions 252 and 253.

The support ribs 650 support the mating tray 610 to the wire clamp housing as illustrated in FIG. 6A, and additional support ribs are illustrated in FIG. 6B. In FIG. 6B, the housing tab receptacle 360 is also illustrated. As noted above, the housing tab receptacle 360 receives a housing tab of the CT housing 232, as described further with reference to FIG. 7A below.

Figure 7A:
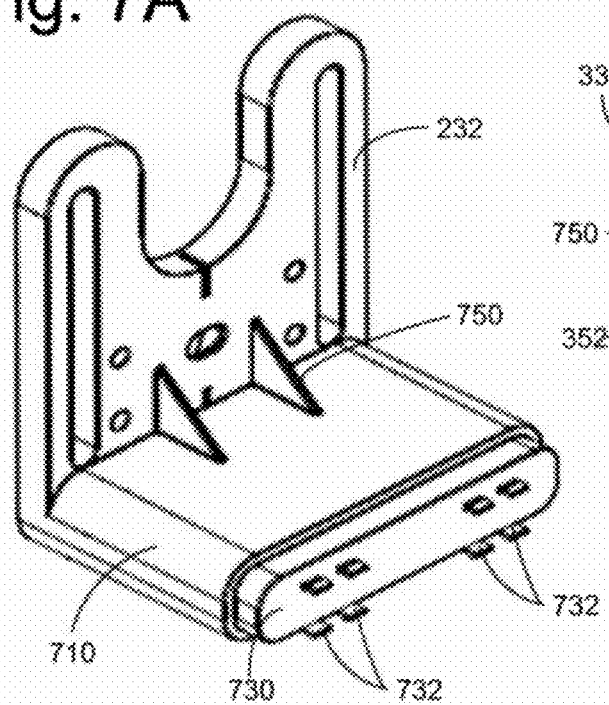
FIGS. 7A-7D illustrate various views of a current transformer housing according to an embodiment of the present invention.
Figure 7B:
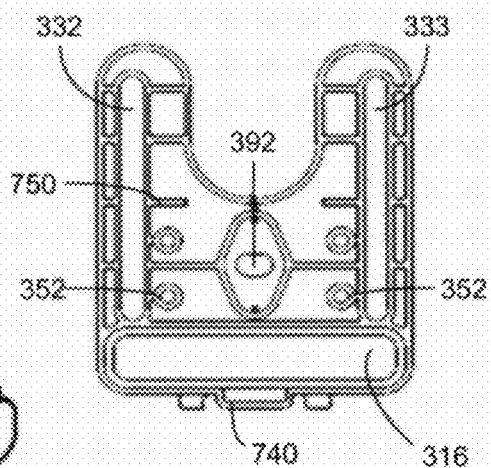
Figure 7C:
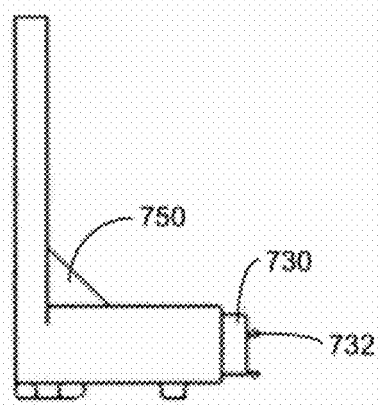
Figure 7D:
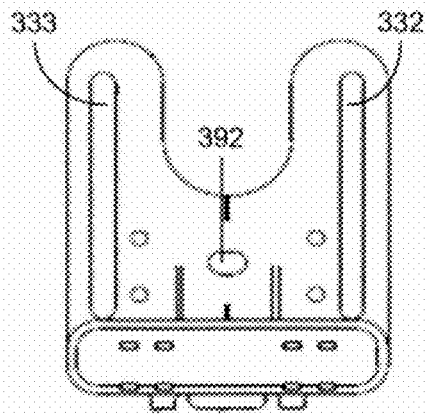

With reference to FIGS. 7A-D, an example embodiment of the CT housing 232 is further described with reference to several views. FIG. 7A is a perspective view of the CT housing 232, FIG. 7B is a front view of the CT housing 232, FIG. 7C is a side view of the CT housing 232, and FIG. 7D is a back view of the CT housing 232. The CT housing 232 includes a mating tray 710 that projects nearly perpendicularly from a bottom of the CT housing 232. The mating tray 710 includes a CT securing tab 730 which is inserted into the housing tab receptacle 360 of the wire clamp housing 253. Alternatively, the CT securing tab 730 may be inserted into the housing tab receptacle 360 of the wire clamp housing 252. At an end of the CT securing tab 730, (8) CT securing tab pins 732 project from the CT securing tab 730. The CT securing tab pins 732 lock into the securing pin receptacles 326 of one of the wire clamp housing portions 252 and 253, along with the securing tab pins 632 of another one of the wire clamp housing portions 252 and 253.

With reference back to FIG. 2A, in one embodiment, the CT housing 232 mates with the second wire clamp housing portion 253 by inserting and locking the CT securing tab pins 732 into the securing pin receptacles 362 of the second wire clamp housing portion 253. In this position, the CT securing tab 730 is fully inserted into the housing tab receptacle 360 of the second wire clamp housing portion 253, and the CT housing 232 is firmly and securely attached and locked to the second wire clamp housing portion 253. Alternatively, the CT housing 232 may be firmly and securely attached and locked to the first wire clamp housing portion 252. As would be understood by one having ordinary skill in the art, the present invention also encompasses other means for attaching the CT housing 232 to the wire clamp housing portions.

As illustrated in FIG. 7B, a mount 740 may be included on a surface of the CT housing 232, to permit an additional enclosure to be attached or mounted to the monitoring device 200. The additional enclosure may enclose additional circuitry such as the circuitry 104 described above. As understood by one having skill in the art, any mounting means may be used to mount another enclosure to the monitoring device 200, if necessary. The CT housing 232 may also include support ribs 750 that support the CT housing mating tray 710. Additional support ribs 750 are illustrated in FIG. 7B.

Figure 8:
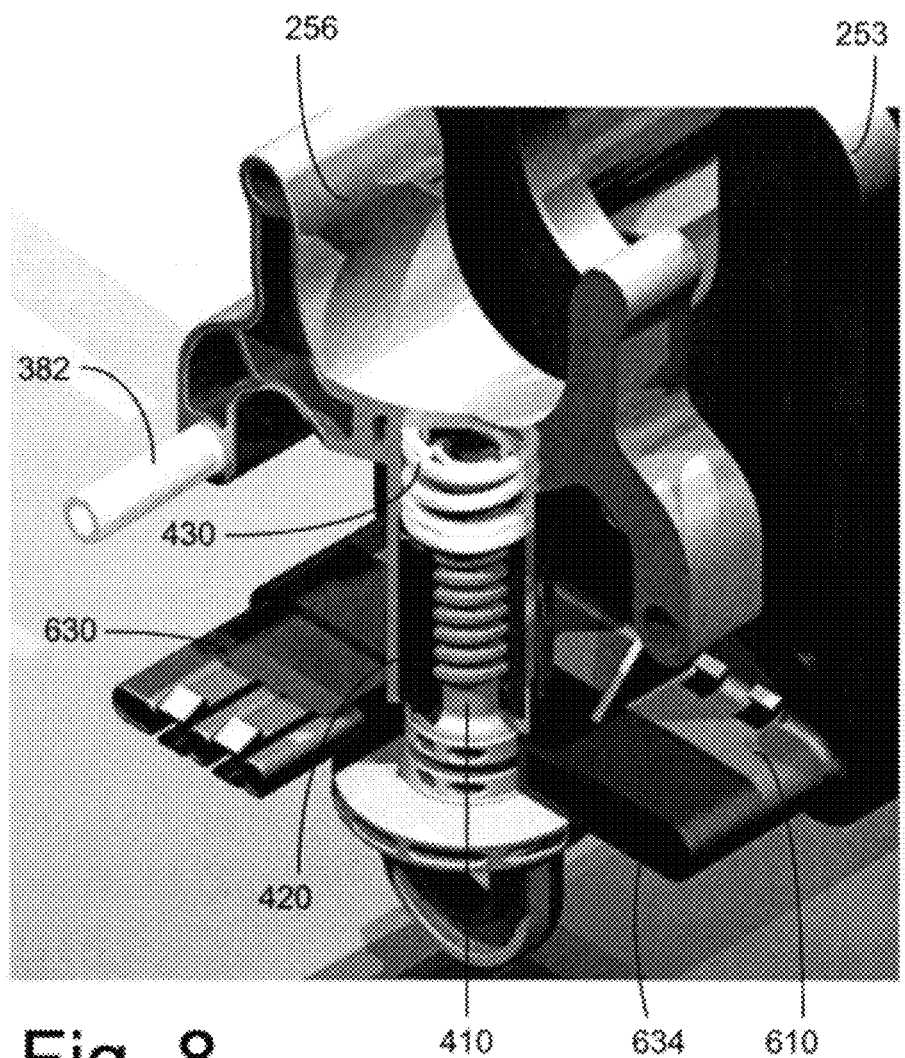
FIG. 8 illustrates a cut-away view of a wire clamp according to an embodiment of the present invention.

Turning to FIG. 8, an assembly of the compression post 256, the second wire clamp housing portion 253, the threaded screw 410, the threaded nut 420, and the compression spring 430 are further described and illustrated. As illustrated, the threaded screw 410 is positioned within the semicircle 620 of the mating tray 610 of the second wire clamp housing portion 253. As described above with reference to FIG. 4B, the compression spring 430 is seated upon one end of the threaded nut 420, and the threaded nut 420 and the compression spring 430 are locked within a cavity of the compression post 256.

Figure 9A:
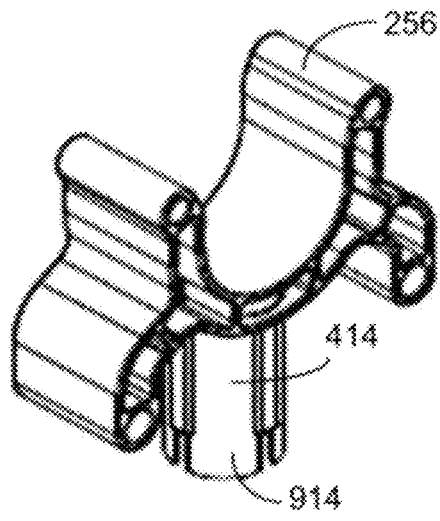
FIGS. 9A-D illustrate various views of a compression post according to an embodiment of the present invention.
Figure 9B:
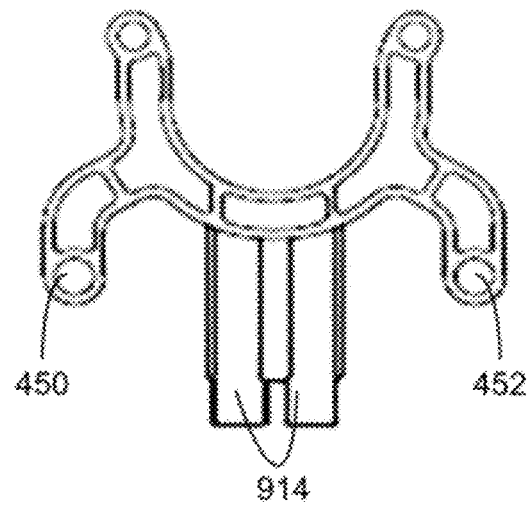
Figure 9C:
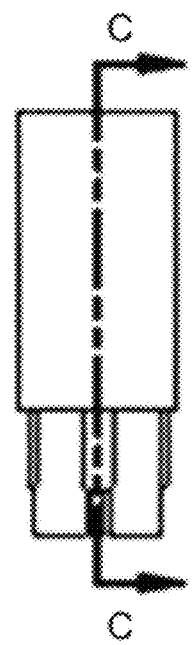
Figure 9D:
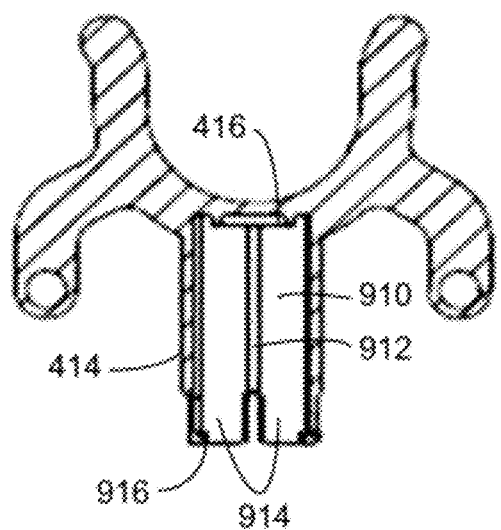

Turning to FIGS. 9A-D, an example embodiment of the compression post 256 is further described and illustrated. FIG. 9A is a perspective view of the compression post 256, FIG. 9B is a front view of the compression post 256, FIG. 9C is a side view of the compression post 256 and designates cross-section C-C, and FIG. 9D illustrates the cross-section C-C of the compression post 256. As illustrated, the cylinder 414 of the compression post 256 includes a cavity 910. The threaded nut 420 and the compression spring 430 may be inserted and locked into the cavity 910 (see FIG. 8). The lower portion of the cylinder 414 includes (4) cylinder fins 914 created by dividing the lower portion of the cylinder 414 into quadrants. It is noted that additional or fewer cylinder fins 914 may be created by dividing the cylinder into additional or fewer portions, according to various embodiments of the present invention. According to aspects of the present invention, the cylinder fins 914 are flexible and expand to permit insertion of the threaded nut and the compression spring 430 into the cavity 910, where locking corners 916 of the cylinder fins 914 lock the threaded nut 420 and the compression spring 430 into the cavity 910. More specifically, the locking corner 916 of each cylinder fin 914 comprises, for example, a projection toward the axis of symmetry of the cylinder. Upon flexible expansion of the cylinder fins 914, the threaded nut 420 and compression spring 430 may be inserted into the cavity 910 past the locking corners 916 and, upon release of the flexible expansion, the locking corners 916 secure and lock the threaded nut 420 and compression spring 430 within the cavity 910. According to an embodiment of the present invention, the cavity 910 includes one or more guide recesses 912 to guide the threaded nut 420 and prevent the threaded nut 420 from rotating while locked within the cavity 910. The guide recesses 412 permit the threaded nut 420 to slide between the first and second positions within the cavity 910, as described above with reference to FIGS. 4A and 4B.

Turning to FIGS. 10A-C, an example embodiment of the clamp arms 254 and 255 is further described and illustrated. FIG. 10A illustrates a perspective view of a clamp arm, FIG. 10B illustrates a back view of a clamp arm, and FIG. 10C illustrates a side view of the clamp arm. The first and second clamp arms 254 and 255 are formed to be interchangeable. Thus, the clamp arm illustrated among FIGS. 10A-C illustrates an embodiment of each of the first and second clamp arms 254 and 255. Each clamp arm comprises two beams 1010. At one end, each beam 110 includes a semicircle curve of approximately 90° in circumference. At another end, a portion of each beam 1010 includes the finger 440 described above with reference to FIG. 4B. It is noted that, because the first and second clamp arms 254 and 255 are formed to be interchangeable, the finger 440 illustrated among FIGS. 10 A-C also illustrates the finger 441.

The two beams 1010 are separated at a distance by the clamp arm pivot post 1020 and the clamp arm fin 1030, which secure the beams 1010 together. The clamp arm post 1020 extends through both beams 1010 and beyond the beams 1010. The clamp arm posts 1020 of the first and second clamp arms 254 and 255 are inserted into the clamp arm pivot holes 340 of the first and second wire clamp housing portions 252 and 253, to create the pivot points 460 and 462.

When the monitoring device 200 is assembled together with both the clamp arms 252 and 253, the curved ends 1010 of the clamp arms may be clamped together to create an inverted "U" shape, which surrounds the electrical conductor 400 and supports the monitoring device from the electrical conductor. Spring mounts 1040 are used to connect ends of the clamp arm springs 370 between the clamp arms 252 and 253 to create a spring bias which holds the clamp arms 252 and 253 in the closed position, so long as the compression post 256 is not at the lowered position.

Turning to FIGS. 11A-C, an example embodiment of the split CT cores 234 and 235 are further described and illustrated. FIG. 11A illustrates a perspective view of a split CT core, FIG. 11B illustrates a side view of a split CT core, and FIG. 11C illustrates a back view of the split CT core. Each split CT core includes a CT pivot post 546 which is inserted into one of the CT pivot holes 390 and 392 as described above. At one end of the CT pivot post 546, a CT pivot post snap tip 1110 is formed to snap and lock into one of the CT pivot holes 390 and 392, while permitting the split CT core to pivot between open and closed positions of the CT 250 about the CT pivot 550 (see FIG. 5B). Each split CT core further includes a CT finger 540 as described above, to open the split CT cores 334 and 235 according to the position of the compression post 256 and the rods 380 and 382. As noted above, a spring may be inserted into or between the CT pivot posts 546 of the split CT cores 234 and 235 to spring bias the CT 250 to a closed position.

Current flowing through the electrical conductor 400 generates a magnetic field that extends around the conductor 400. The magnetic field couples to the split CT cores 234 and 235 and induces a current in an electrical wire winding (not shown) wrapped around one or both of the split CT cores 234 and 235 that is directly proportional to the current flowing through the electrical conductor 400 and a number of turns of the electrical wire winding. It is noted that the CT 250 includes both a primary winding and a secondary winding. That is, electrical conductor 400 and electrical wire winding act as primary and secondary windings, respectively. An electrical connector (not shown) routes a current induced in the electrical wire winding to a circuitry housing, such as the cavity 316, which houses the circuitry 104, for example. Among embodiments of the present invention, the electrical connector may be flexible or disposed in a rigid structure, such as a conduit, that protects the electrical connector.

In one embodiment, the split CT cores are formed by winding layers of metal around a magnetic form, such as a mandrel, to form a core, and then splitting the core into the split CT cores 234 and 235. The magnetic core of the split CT cores comprise a magnetic core material such as grain-oriented steel, supermalloy, permalloy, ferrites, combinations thereof, and/or other materials known in the art to be suitable for the application. In some embodiments, the magnetic core may further include an epoxy coating to seal the magnetic core from the environment and protect the magnetic core. The core may be coated with epoxy either before or after being split into the sections 234 and 235. Further, the core may be vacuum-impregnated with a varnish approximately 0.2 to 0.6 mil thick, for example, to hold laminations of the core together and protect the core from moisture. In one embodiment, the core is designed for use at an operational frequency of 60 Hz, although the core may be designed for use at other operational frequencies.

In some embodiments, a reference voltage of circuitry associated with the monitoring device 200, such as the circuitry 104, is brought to the voltage potential of the electrical conductor 400 by an electrical coupling or resistive electrical coupling between the circuitry 104 and the electrical conductor 400. Certain aspects of the present invention include a pad of semi-conductive material disposed between the electrical conductor 404 and the monitoring device 200 to slow a rate of change difference in voltage potential between the electrical conductor 400 and the monitoring device 200, when securing the monitoring device 200 to the electrical conductor 400. For example, the pad of semi-conductive material may have an electrical resistance of between about 7 and 40 Ohms/cm. Slowing down the rate of change can minimize the risk of corona discharge upon securing and/or electrically coupling the monitoring device 200 to the electrical conductor 400. It is additionally noted that a substantially equal voltage potential and electric field between the electrical conductor 400 and the circuitry 104 permits the monitoring device 200 to communicate wirelessly with reduced noise and interference. A person of ordinary skill in the art having the benefit of the present disclosure will recognize an appropriate means to bring the circuitry 104 to the line potential of the electrical conductor 400 without departing from the spirit and scope of the invention. For example, one or more electrically conductive and/or resistive wires, pins, or other members could be used.

Figure 12:
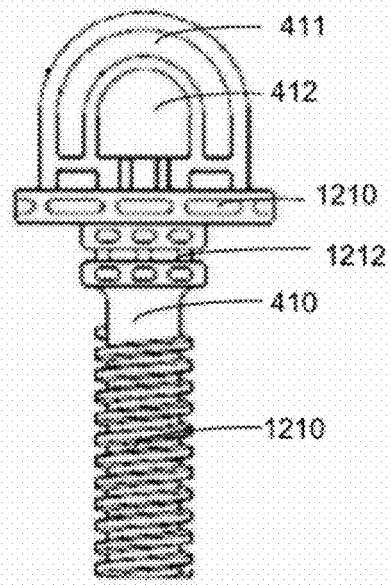
FIG. 12 illustrates a threaded screw according to an embodiment of the present invention.

Turning to FIG. 12, an example embodiment of the threaded screw 410 is further described. At one end of the threaded screw 410, a hook 411 is formed that encloses an eye 412 for twisting the threaded screw 410 with a hotstick by a field technician. When assembled with the first and second wire clamp housing portions 252 and 253, the threaded screw table 1210 is seated upon an exterior bottom surface of the first and second wire clamp housing portions 252 and 253 (see FIG. 8). Additionally, when assembled with the first and second wire clamp housing portions 252 and 253, the threaded screw guide 1212 is positioned to fit within the semicircles 620 (see FIG. 6A) of the first and second wire clamp housing portions 252 and 253. More specifically, when the threaded screw guide 1212 is positioned between the semicircles 620, the semicircles 620 lock the threaded screw 410 into position between the first and second wire clamp housing portions 252 and 253 while permitting the threaded screw 410 to rotate about its axis of symmetry.

Figure 13A:
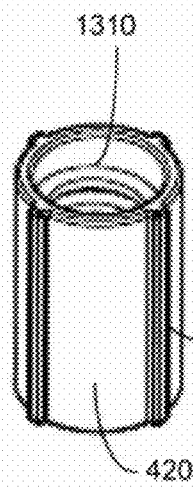
FIGS. 13A-C illustrate various views of a threaded nut according to an embodiment of the present invention.
Figure 13B:
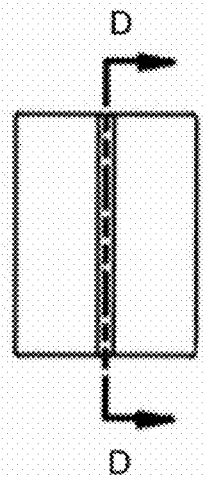
Figure 13C:
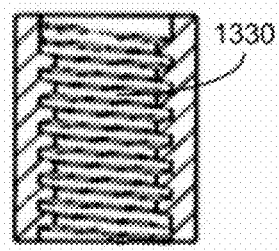

Turning to FIGS. 13A-C, an example embodiment of the threaded nut 420 is further described and illustrated. FIG. 13A is a perspective view of the threaded nut 420, FIG. 13B is a side view of the threaded nut 420 and designates cross-section view D-D, and FIG. 13C is the cross-section view D-D of the threaded nut 420. As illustrated, the threaded nut 420 includes one or more raised guide rails 1320. The raised guide rails 1320 are formed to fit into the guide recesses 912 of the cavity 910 of the compression post 256. Along with the guide recesses 912, the raised guide rails 1320 prevent the threaded nut 420 from rotating within the cavity 910 of the compression post 256 while permitting the threaded nut 420 to slide between the first and second positions within the cavity 910 as discussed above. The threaded nut 420 also includes spring tray 1310. The compression spring 430 is seated upon the spring tray 1310, and the threaded nut 420 and the compression spring 430 are inserted into the cavity 910 of the compression post 256 to a position past the locking corners 916 of the cylinder fins 914, to lock the threaded nut 420 and the compression spring 430 within the cavity 910. It is noted that the thread 1330 of the threaded nut 420 mates with the thread 1210 of the threaded screw 410.

Figure 14A:
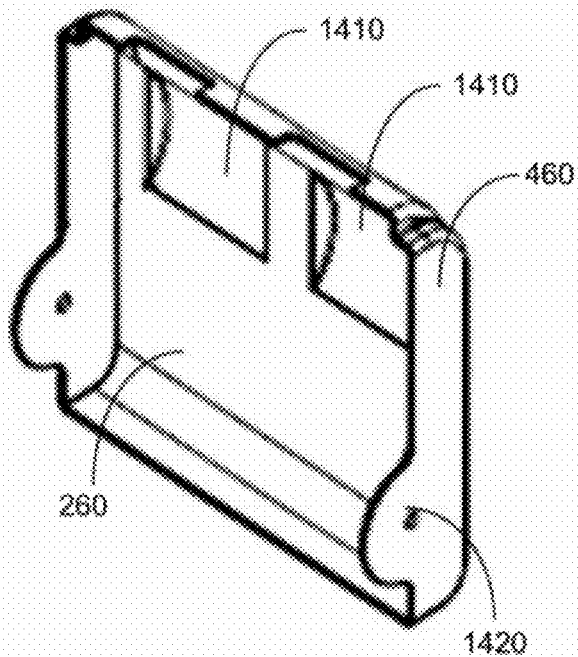
FIGS. 14A-B illustrate a cover according to embodiments of the present invention.
Figure 14B:
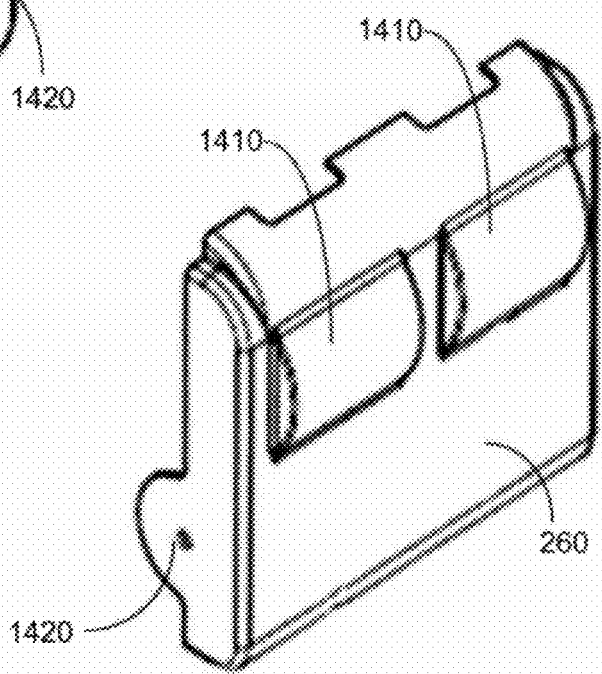

Turning to FIGS. 14A and 14B, an example of the covers 260 of the monitoring device 200 are further described and illustrated. As illustrated, the covers 260 include recesses 1410 for accommodating the split CT cores and clamp arms when the monitoring device 200 is in the open position. Additionally, the covers 260 include securing holes 1420 to secure the cover to the mounting holes 350 and 352 using a pin or other fastening means, for example.

Although specific embodiments have been described above in detail, the description is merely for purposes of illustration. It should be appreciated, therefore, that many aspects of the invention were described above by way of example only and are not intended as required or essential elements of the invention unless explicitly stated otherwise. Various modifications of, and equivalent steps corresponding to, the disclosed aspects of the exemplary embodiments, in addition to those described above, can be made by a person of ordinary skill in the art, having the benefit of this disclosure, without departing from the spirit and scope of the invention defined in the following claims, the scope of which is to be accorded the broadest interpretation so as to encompass such modifications and equivalent structures.

What is claimed is:

1. An apparatus for securing to and collecting power from an electrical conductor, comprising:
   a wire clamp comprising a compression post and clamp arms that clamp to and secure the apparatus to an electrical conductor;
   a current transformer ("CT") that clamps to the electrical conductor and collects power from the electrical conductor;
   a housing that supports the wire clamp and the current transformer, the housing comprising channels; and
   one or more rods disposed within the channels and secured by the compression post such that the rods slide between first and second positions within the channels based upon movement of the compression post,
   wherein the wire clamp and the current transformer are opened when the compression post is moved into a first position, and the wire clamp and the current transformer are closed when the compression post is moved into a second position.

2. The apparatus of claim 1, wherein the clamp arms surround and compress the electrical conductor along with the compression post in a closed position of the wire clamp based on movement of the compression post.

3. The apparatus of claim 2, wherein
   each of the clamp arms includes pivot posts,
   the pivot posts are positioned within pivot holes of the housing, and
   the clamp arms pivot between closed and open positions.

4. The apparatus of claim 1, wherein the current transformer comprises a split magnetic core that surrounds the electrical conductor in a closed position of the current transformer.

5. The apparatus of claim 4, wherein
   the split magnetic core includes pivot posts,
   the pivot posts are positioned within pivot holes of the housing, and
   the split magnetic core pivots between closed and open positions.

6. The apparatus of claim 1, wherein, at the first position of the rods, the rods secure the wire clamp and current transformer in a closed position.

7. The apparatus of claim 1, wherein, at the second position of the rods, the rods pivot the wire clamp and current transformer to an open position.

8. The apparatus of claim 1, wherein
   the wire clamp further comprises a compression spring and a threaded nut locked within a cavity of the compression post.

9. The apparatus of claim 8, wherein
   the wire clamp further comprises a threaded screw,
   the threaded screw extends through an opening in the housing into the threaded nut, and
   the threaded screw is rotatable about an axis of symmetry.

10. The apparatus of claim 9, wherein the threaded nut compresses the compression spring to one end of the cavity of the compression post based upon rotation of the threaded screw, to elevate the compression post.

11. The apparatus of claim 1, wherein the wire clamp comprises clamp arms and a spring that biases the clamp arms to a closed position.

12. The apparatus of claim 1, further comprising a circuitry housing that encloses monitoring circuitry that monitors the electrical conductor.

13. An apparatus for securing to and collecting power from an electrical conductor, comprising:
    a wire clamp that clamps to and secures the apparatus to the electrical conductor, the wire clamp including a threaded screw rotatable about an axis of symmetry to adjust and secure the apparatus to the electrical conductor;
    a current transformer ("CT") that clamps to the electrical conductor and collects power from the electrical conductor, wherein rotation of the threaded screw opens and closes the wire clamp and the CT;

a circuitry housing including a cavity that encloses circuitry associated with the apparatus, the housing comprising channels; and one or more rods disposed within the channels and secured by a compression post such that the rods slide between first and second positions within the channels based upon movement of the compression post.

14. The apparatus of claim 13, wherein the circuitry includes one or more sensors, and wireless communications circuitry.

15. The apparatus of claim 14, wherein the CT includes a core and an electrical winding that receives an induced current from magnetic flux generated according to alternating current present on the electrical conductor.

16. The apparatus of claim 14, wherein the circuitry further includes a circuit configured to convert the induced current into energy to be stored for consumption by the sensors and the wireless communications circuitry.

17. The apparatus of claim 13, wherein the CT comprises first and second magnetic core sections, the first and second magnetic core sections being integrated with the apparatus to be separable.

18. The apparatus of claim 13, wherein the CT includes and the wire clamp include one or more springs to spring bias the CT and the wire clamp to a closed position.

19. A method for securing to and collecting power from an electrical conductor, comprising:

twisting a threaded screw in a first direction to move a wire clamp and a current transformer ("CT") from a closed position to an open position;

positioning the wire clamp and the CT such that an electrical conductor occupies a recess within the wire clamp and the current transformer;

twisting the threaded screw in a second direction;

sliding one or more rods from a first position to a second position, the rods disposed within channels of a housing which supports the CT; and moving the wire clamp and the CT from the open position to the closed position to secure the wire clamp and the CT to the electrical conductor.

* * * * *